United States Patent
Moroz

(10) Patent No.: US 7,141,763 B2
(45) Date of Patent: Nov. 28, 2006

(54) METHOD AND APPARATUS FOR RAPID TEMPERATURE CHANGE AND CONTROL

(75) Inventor: Paul Moroz, Marblehead, MA (US)

(73) Assignee: Tokyo Electron Limited, Tokyo (JP)

( * ) Notice: Subject to any disclaimer, the term of this patent is extended or adjusted under 35 U.S.C. 154(b) by 58 days.

(21) Appl. No.: 10/809,787

(22) Filed: Mar. 26, 2004

(65) Prior Publication Data

US 2005/0211694 A1 Sep. 29, 2005

(51) Int. Cl.
*F27B 5/14* (2006.01)
*C23C 16/00* (2006.01)

(52) U.S. Cl. .......... 219/390; 219/405; 219/443.1; 219/411; 219/444.1; 392/416; 392/418; 118/724; 118/725; 118/50.1; 118/728

(58) Field of Classification Search .......... 219/390, 219/405, 411, 443.1, 444.1, 465.1, 466.1, 219/447.11; 392/416, 418; 118/724, 725, 118/50.1, 728–730
See application file for complete search history.

(56) References Cited

U.S. PATENT DOCUMENTS 5,802,856 A * 9/1998 Schaper et al. ............ 62/3.7
6,474,986 B1 * 11/2002 Oda et al. .................. 432/247
6,731,496 B1 * 5/2004 Hiramatsu et al. ....... 361/321.2

* cited by examiner

*Primary Examiner*—Shawntina Fuqua
(74) *Attorney, Agent, or Firm*—Pillsbury Winthrop Shaw Pittman LLP

(57) ABSTRACT

An apparatus and a method for controlling the temperature of a substrate during substrate processing. The apparatus comprises a substrate table having a thermal surface supporting the substrate. The apparatus also comprises a first thermal assembly arranged in the substrate table and comprising a plurality of thermoelectric modules, each of the plurality of thermoelectric modules having a thermoelectric surfaces such that the plurality of thermoelectric modules defines a plurality of thermoelectric surfaces. In this apparatus, the plurality of thermoelectric surfaces is in thermal communication with the thermal surface and includes various shapes of thermoelectric surfaces, and the plurality of thermoelectric surfaces is configured to substantially completely underlie the thermal surface. The method comprises controlling a temperature of the thermal surface with a plurality of thermoelectric modules, the plurality of thermoelectric modules defining a plurality of thermoelectric surfaces and the plurality of thermoelectric surfaces including various shapes of thermoelectric surfaces.

42 Claims, 8 Drawing Sheets

METHOD AND APPARATUS FOR RAPID TEMPERATURE CHANGE AND CONTROL

BACKGROUND OF THE INVENTION

1. Field of the Invention

This invention relates to an apparatus and a method for controlling the temperature of a substrate. More particularly, this invention relates to an apparatus and a method for performing temperature change and temperature control of a substrate.

2. Description of Related Art

The demand for increasing throughput in semiconductor devices, displays and other types of substrate manufacturing is never-ending. In semiconductor technology, for example, due to significant capital and operating expenses, even small improvements in the equipment or in the methods of using the equipment can lead to a significant financial advantage.

Many of the processes in substrate processing involve placing the substrate, such as a semiconductor wafer, on a substrate table of a processing system and processing the substrate. These processes generally include chemical processes, plasma induced processes, and etching and deposition processes, and generally depend on the temperature of the substrate.

SUMMARY OF THE INVENTION

In an aspect of the invention, there is provided an apparatus for controlling the temperature of a substrate during substrate processing. According to an embodiment of the invention, the apparatus includes a substrate table having a thermal surface supporting the substrate lower surface. The apparatus also includes a first thermal assembly arranged in the substrate table and comprising a plurality of thermoelectric modules, each of the plurality of thermoelectric modules having a thermoelectric surface such that the plurality of thermoelectric modules defines a plurality of thermoelectric surfaces. In this apparatus, the plurality of thermoelectric surfaces is in thermal communication with the thermal surface and includes various shapes of thermoelectric surfaces, and the plurality of thermoelectric surfaces is configured to substantially completely underlie the thermal surface.

In another aspect of the invention, there is provided a method for controlling the temperature of a substrate during substrate processing. According to an embodiment of the invention, the method includes controlling a temperature of the thermal surface with a plurality of thermoelectric modules, the plurality of thermoelectric modules defining a plurality of thermoelectric surfaces and the plurality of thermoelectric surfaces including various shapes of thermoelectric surfaces.

In yet another aspect of the invention, there is provided a method of making a substrate table capable of controlling a temperature of a substrate, the substrate having an upper surface and a lower surface supported by a thermal surface of the substrate table. According to an embodiment of the invention, the method includes arranging a plurality of thermoelectric modules in the substrate table, the plurality of thermoelectric modules defining a plurality of thermoelectric surfaces and the plurality of thermoelectric surfaces including various shapes of thermoelectric surfaces.

BRIEF DESCRIPTION OF THE DRAWINGS

The above and other features of the present invention will be described in conjunction with the accompanying drawings in which.

DETAILED DESCRIPTION OF SEVERAL EMBODIMENTS OF THE INVENTION

In the following description, in order to facilitate a thorough understanding of the invention and for purposes of explanation and not limitation, specific details are set forth, such as a particular geometry of the substrate table and various shapes of the thermoelectric modules. However, it should be understood that the invention may be practiced in other embodiments that depart from these specific details.

The present invention provides an apparatus and a method for temperature change and control of any type of equipment, including that used for materials processing, such as etching or deposition. More particularly, the apparatus and the method may be used, in an embodiment of the invention, for temperature change and control of the thermal part or upper body of a substrate table on which a substrate is disposed.

Figure 1:
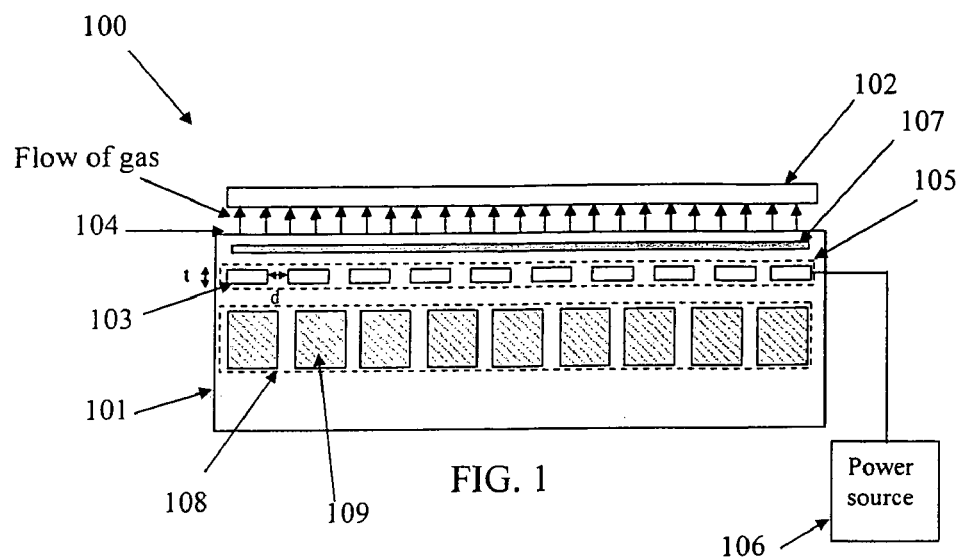
FIG. 1 is a cross sectional representation of a substrate holder according to an embodiment of the invention.

Referring to FIG. 1, an apparatus, according to an embodiment of the invention, for controlling the temperature of a substrate during substrate processing will now be explained.

Apparatus 100 comprises substrate table 101 on which substrate 102 is disposed. Apparatus 100 further comprises first thermal assembly 105 that is configured to control the temperature of thermal surface 104 of substrate table 101. First thermal assembly 105 includes a plurality of thermoelectric modules 103, spaced apart at a distance d from one another, in which each module can be controlled by power source 106. In the embodiment illustrated in FIG. 1, the plurality of thermoelectric modules is embedded in the substrate table 103 at a substantially equal distance from the thermal surface 104, thereby forming a thermoelectric control layer 105 of a thickness t. Depending on the size of the thermoelectric modules, the thickness t of thermoelectric control layer 105 may be within the millimeter range, for example, between about 2 and about 9 mm in an embodiment of the invention.

Apparatus 100 also comprises electrode 107 configured to electrostatically clamp substrate 102 on thermal surface 104 during substrate processing. In this embodiment, a backside flow of gas, such as helium, is provided to enhance the thermal conductivity between substrate table 101 and substrate 102. The actual distance between substrate 102 and substrate table 101 may be small, for example in a micron range. Finally, apparatus 100 further includes second thermal assembly 108, likewise in thermal communication with thermal surface 104 of substrate table 101.

In the embodiment represented in FIG. 1, second thermal assembly 108 comprises a plurality of channels 109 that carries a heat-transfer fluid. Although not shown in FIG. 1, the temperature of the fluid is controlled by an external chiller that is configured to heat or cool the fluid. In this embodiment, heating or cooling is by direct thermal conduction, from the heat-transfer fluid to the thermal surface 104, via channels 109, first thermal assembly 105 and electrode 107.

In the embodiment illustrated in FIG. 1, the plurality of thermoelectric modules 103 can allow for higher precision and faster response of the temperature control of thermal surface 104. This is done by varying the current and the voltage supplied to the plurality of thermoelectric devices 103 with variable DC power source 106. In that way, negative effects such as temperature non-uniformity, temperature inertia and reduced cooling capability, which are generally encountered with heaters like the second thermal assembly, may be resolved.

As shown in FIG. 1, first thermal assembly 105 effectively separates the upper body of the substrate holder from its lower body. The upper body includes upper surface 104, where the temperature should be controlled, while the lower body includes channels 109 containing the heat-transfer fluid. In the embodiment represented in FIG. 1, channels 109 may be used for temperature change and control of the lower surface of the first thermal assembly. In an embodiment of the invention, the upper body of substrate table 101 is relatively narrow, such that the distance separating first thermal assembly 105 from thermal surface 104 is within a range of millimeters, for example less than about 10 mm.

As mentioned previously, the plurality of thermoelectric devices 103 is configured to control the temperature of thermal surface 104. They can also sustain a temperature difference of, for example, several tens of degrees (50–60° C. in an embodiment of the invention) and possibly on the order of a hundred degrees. Accordingly, this temperature difference can compensate for a fluid that does not yet have the exact desired temperature necessary for the substrate processing. In operation, the thermoelectric devices 103 are provided with varying current and voltage to compensate for or sustain any temperature differences required for the temperature control of thermal surface 104. The thermoelectric devices 103 are also able to adjust their temperatures more rapidly than the fluid system of second thermal assembly 108.

Figure 2:
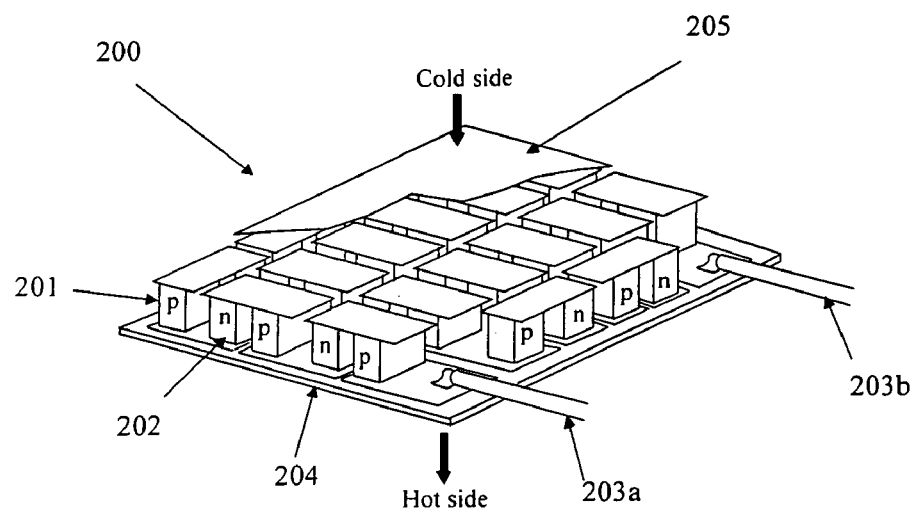
FIG. 2 is a schematic representation of a Peltier module used in the first thermal assembly according to an embodiment of the invention.

In an embodiment of the invention, the plurality of thermoelectric devices 103 may comprise Peltier modules. Peltier modules are small solid-state devices that function as heat pumps. They are based on the fact that application of voltage to two joint materials in some cases produces heat release or heat absorption, depending on the polarity, near the contact region. A Peltier module, according to an embodiment of the invention, is shown in FIG. 2. This module 200 includes p-type 201 and n-type 202 semiconductor materials connected by conductors 203a–b and enclosed between ceramic layers 204 and 205. In operation, when electric power is applied to the Peltier module, one side of the device becomes colder while the other side becomes hotter. Changing voltage polarity reverses the effect, and the side with the heat absorption becomes the heat releasing side, and vice versa. With these solid state devices, the heating power and the cooling power are approximately in direct proportion to the electric power or to the applied voltage.

Manufacturing processes used for the production of Peltier modules are well developed and generally include semiconductor manufacturing techniques, such as deposition, lithographic and etch processes. As a result, the physical and electrical characteristics of these devices may be adjusted according to desired specifications or specific needs. It follows that the size and the material used in the p-n junctions of the Peltier modules illustrated in FIG. 2 may easily be modified. Therefore, although the Peltier module represented in FIG. 2 has a flat rectangular shape (for example about 4 cm by about 5 cm) and a thickness in the millimeter range (for example, about 4 mm), it should be understood that this device may have other shapes including, for example, a circular shape, a ring shape, a triangular shape, a square shape, a polygonal shape or an oval shape.

In order to maximize the performance of the Peltier modules, heat sinks or heat sources may be connected to the Peltier modules during the heating or cooling of thermal surface 104. In the cooling phase, heat sinks connected to lower side 204 would manage to carry off the heat effectively, thereby keeping the backside temperature at a specified value. In such a case, upper side 205 of device 200 will not absorb the heat created on lower side 204. This permits fast cooling and more generally, rapid, precise and convenient temperature change and control of thermal surface 104. In an embodiment of the invention, the second thermal assembly may act as heat sink, or heat source, or both. In such a case, the distance separating second thermal assembly 108 from first thermal assembly 105 may be in the range of millimeters (for example, 1 to 20 mm) in order to maximize the thermal interaction between lower side 204 of the Peltier modules and second thermal assembly 108. In an alternative embodiment, a heat sink or heat source connected to the first thermal assembly, and separated from second thermal assembly 108, may be disposed in substrate table 101. For example, heat sinks can include re-circulating fluid channels (using, for example, forced convection liquid-phase fluid, forced convection gaseous-phase fluid, or free convection mixed liquid-gaseous-phase fluid, i.e., heat pipe), as described above. Additionally, for example, heat sources can include re-circulating fluid channels, or resistive heating elements. in an alternative embodiment, a material layer can be positioned between the lower surface of the first thermal assembly 105 and the upper surface of the second thermal assembly 108 in order to alter the thermal conduction between the two thermal assemblies. Potential candidates for a material layer may comprise in an embodiment of the invention thermal interface materials, like, silicon-based greases, elastomeric pads, thermally conductive tapes, or thermally conductive adhesives.

A typical Peltier module provides a temperature difference of several tens of degrees Celsius. With forced cooling of the hot side, the second side may reach temperatures below zero degrees Celsius. In order to obtain larger temperature differences, multi-stage Peltier modules may be used in an embodiment of the invention. In such a case, several Peltier modules are stacked up and a cascade connection is created between them. In this configuration, the hot side of a Peltier module is thermally connected to the cold side of an adjacent module. In doing so, temperature changes may be done quickly and temperature change rates higher than one degree Celsius per second may be attained.

Figure 3:
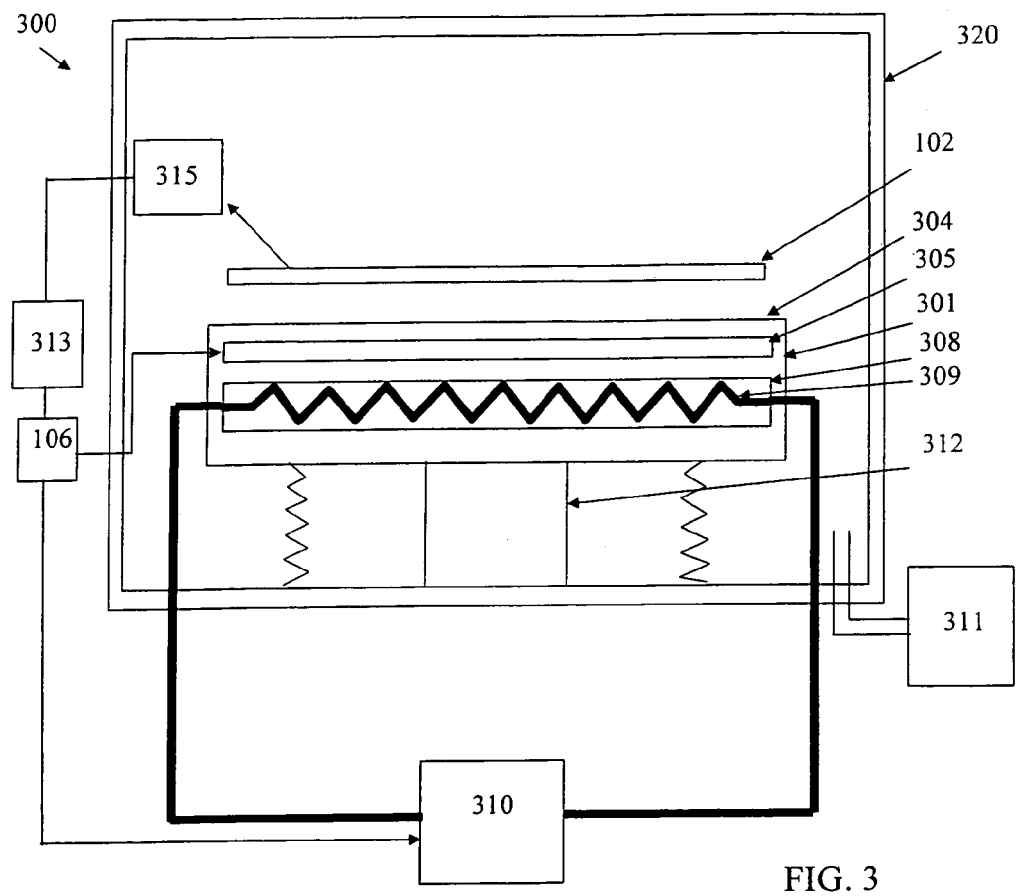
FIG. 3 is a schematic representation of a substrate processing system according to an embodiment of the invention.

Referring now to FIG. 3, an exemplary embodiment of a substrate processing system capable of controlling the temperature of a substrate during substrate processing will now be explained.

Substrate processing system 300 comprises vacuum chamber 320 in which substrate table 301 is arranged. Similarly to the embodiment shown in FIG. 1, substrate table 301 comprises thermal surface 304, on which substrate 102 is disposed, first thermal assembly 305 and second thermal assembly 308. Substrate processing system 300 further comprises a moving assembly 312, configured to vertically move substrate table 301 within processing chamber 320, and pumping system 311 constructed and arranged to maintain a desired pressure inside chamber 320. In the embodiment illustrated in FIG. 3, first thermal assembly 305 may be identical to thermal assembly 105 shown in FIG. 1 and includes a plurality of thermoelectric modules, such as Peltier devices, configured to change the temperature of thermal surface 304. In FIG. 3, the second thermal assembly is a fluid circulation system that comprises channel 309, which carries a heat-transfer fluid and which is in fluid communication with chiller 310. In such a case, second thermal assembly 308 may be identical to the second thermal assembly shown in FIG. 1 and may include a plurality of channels arranged in substrate table 301. In this configuration, the temperature of the fluid is controlled by external chiller 310, which is configured to heat or cool the fluid inside channel 309. In another embodiment of the invention, second thermal assembly 308 may comprise a resistive heater connected to a variable power source. In either embodiment, heating or cooling is achieved by direct thermal conduction, from channel 309, or the resistive heater, to thermal surface 304, via first thermal assembly 305.

Figure 4:
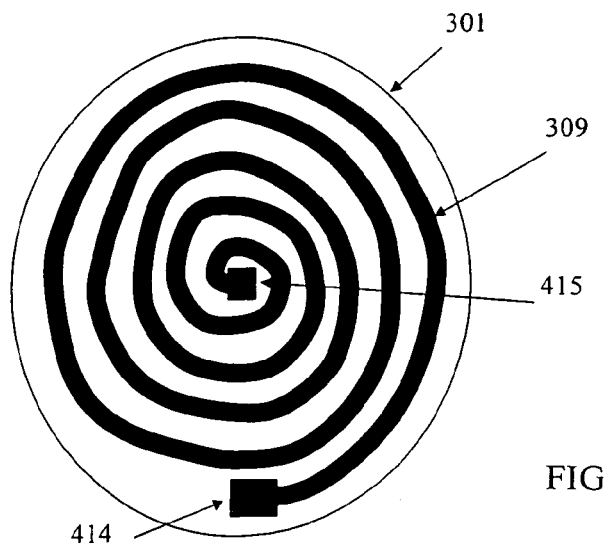
FIG. 4 is a top view of the second thermal assembly embedded in the substrate table according to an embodiment of the invention.

It should be understood that channel 309 which carries the heat-transfer fluid may have different shapes. In an embodiment of the invention, channel 309 has a spiral shape and is designed to thermally cover a substantial area of thermal surface 304. This embodiment is depicted in FIG. 4, which represents a schematic top view of channel 309 embedded inside substrate table 301. As can be seen in this figure, channel 309 comprises inlet 414 and outlet 415 that are in fluid communication with chiller 310. In FIGS. 3 and 4, the location of the channel 309 relative to thermal surface 304 is such that efficient heat transfer to and uniform temperature distribution on the thermal surface is performed. In an embodiment of the invention, the distance separating channel 309 from thermal surface 304 is in the range of millimeters (for example, 1 to 30 mm).

It should also be understood that substrate processing system 300 shown in FIG. 3 may be a plasma processing system, an etch system, a Chemical Vapor Deposition (CVD) system, a plasma enhanced CVD (PECVD) system, a Physical Vapor Deposition (PVD) system, an ionized PVD (iPVD) system, or a non-plasma processing system such as a track system, a chemical oxide removal (COR) system, or more generally, any type of system in which the temperature of the substrate must be controlled during substrate processing. In a plasma processing configuration, for example, substrate processing system 300 may include a plasma generating system and a gas source configured to introduce gas into chamber 320 for creating a processing plasma. In operation, substrate 102 may be clamped to substrate table 301 via electrostatic, suction, or mechanical means. Usually, for chemical and/or plasma processing, substrate table 301 and substrate 102 are placed in chamber 320, where a reduced pressure is attained via pumping system 311. Although not shown in the embodiment represented in FIG. 3, substrate processing system 300 may also include additional process gas lines entering processing chamber 320, a Radio Frequency (RF) power system, a second electrode for a capacitively-coupled type system or an RF coil for an inductively coupled type system.

During processing of substrate 102, adjustment and control of the temperature of the thermal surface may be achieved via wafer temperature measurement system 315 arranged in chamber 320. In an embodiment of the invention, temperature measurements of substrate 102 are taken by wafer temperature measurement system 315 and input into wafer temperature control system 313, which correlates the temperature measurements with the appropriate voltage. In case the temperature needs be adjusted, control system 313 commands the power supply 106 to send the required voltage or current to the plurality of thermoelectric modules of first thermal assembly 305. In the embodiment of the invention shown in FIG. 3, control system 313 may also be configured to adjust/control the temperature of the fluid supplied by chiller 310 based on the measurements of wafer temperature measurement system 315.

As can be seen in FIG. 3, measurements of the temperature of substrate 102 may be performed using optical techniques, such as an optical fiber thermometer commercially available from Advanced Energies, Inc. (1625 Sharp Point Drive, Fort Collins, Colo., 80525), Model No. OR2000F capable of measurements from 50 to 2000 C and an accuracy of plus or minus 1.5 C, or a band-edge temperature measurement system as described in pending U.S. patent application Ser. No. 10/168,544, filed on Jul. 2, 2002, the contents of which are incorporated herein by reference in their entirety. In another embodiment of the invention, measurements of the substrate temperature may be done with thermocouples embedded in various parts of substrate table 301. In this latter configuration, the thermocouples may be directly connected to substrate temperature control system 313 that commands the plurality of thermoelectric devices via power supply 106.

In an embodiment of the invention, the heating phase, the cooling phase or the temperature-hold phase, when the temperature should be held at a specified value, may be done in the following manner.

In the beginning of the heating phase, heating of thermal surface 304 is accomplished with first and second thermal assembly, 305 and 308. Practically, a full DC voltage is applied to first thermal assembly 305, which comprises a plurality of Peltier modules. In this configuration, the upper surfaces of the Peltier modules are heated via the Peltier effect while the bottom surfaces of these modules are cooled down. Heat coming from channel 309 of second assembly 308 will keep the temperature of the lower surfaces of the modules from falling too much. In this case, the second thermal assembly acts as a heat source and reduces the risk of cooling down the upper surface of the modules. In an embodiment of the invention, use of a fast temperature chiller capable of rapidly increasing the temperature of the fluid may be desirable. In FIG. 3, a temperature increase of the fluid within channel 309 heats the second thermal assembly 308 and, hence, the lower surface of first thermal assembly 305 and, through first assembly 305, the upper body of substrate table 301 and thermal surface 304. The combined effect of first thermal assembly 305 and second assembly 308 accelerates the heating phase. At the end of the heating phase, when the temperature of thermal surface 304 comes close to the target temperature, the voltage supplied to the plurality of Peltier modules is reduced in order to prevent temperature overshooting.

The cooling phase, according to an embodiment of the present invention, takes into account the fact that, in operation, the heating power of the Peltier modules is generally two or three times greater than the cooling power. This leads to the cooling strategy illustrated in FIGS. 5a and 5b.

Figure 5A:
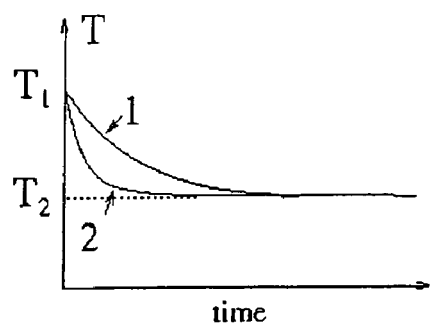
FIG. 5a illustrates a cooling strategy, which is adopted in the case where the temperature change is small, according to an embodiment of the invention. This figure compares the cooling obtained with a conventional thermal assembly and the cooling obtained with a combination of a conventional thermal assembly and a fast thermal assembly including a plurality of thermoelectric modules.

Referring now to FIG. 5a, a cooling strategy that applies to the situation where temperature reduction (from $T_1$ to $T_2$) of the thermal surface is relatively small will now be explained.

This strategy consists of applying a full negative DC voltage to the plurality of the Peltier modules in order to rapidly decrease the temperature of thermal surface 304 to $T_2$. The result of this strategy is illustrated in FIG. 5a, which compares variations of the temperature of thermal surface 304 obtained with second thermal assembly 308 alone (curve 1) with variations of the temperature of thermal surface 304 obtained with the combined effect of second assembly 308 and the Peltier modules (curve 2). As can be seen in this graph, the target temperature $T_2$ is rapidly reached with the use of the Peltier modules and second thermal assembly 308.

In an embodiment of the invention, it may be desirable to use the full negative DC voltage only during the initial period of the cooling phase. In that case, when the temperature becomes close to the target temperature $T_2$, the DC voltage is decreased in order to prevent temperature overshooting. In FIG. 5a, it should be noted that the steep front of the curve 2 is mainly due to the action of the Peltier modules. Naturally, it should be understood that cases of even small temperature ranges may be handled by first thermal assembly 305 alone, i.e. without changing the second thermal assembly 308 setup.

Figure 5B:
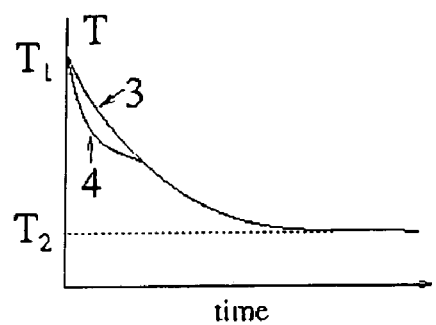
FIG. 5b illustrates a cooling strategy, which is adopted in the case where the temperature change is large, according to an embodiment of the invention. This figure compares the cooling obtained with a conventional thermal assembly and the cooling obtained with a combination of a conventional thermal assembly and a fast thermal assembly including a plurality of thermoelectric modules.

Referring now to FIG. 5b, a cooling strategy that applies to the situation where the temperature reduction (from $T_1$ to $T_2$) of the thermal surface 304 is relatively large will now be explained.

In the case where the desired temperature reduction is large, for example the desired temperature reduction exceeds the maximum temperature difference attainable by the Peltier elements, application of a maximum DC voltage of negative polarity to the Peltier modules may not be capable of producing this temperature change, or alternatively would make it too slow. Therefore, the approach, taken in an embodiment of the invention, consists of relying mainly on the second thermal assembly to provide the cooling. This is accomplished by decreasing the temperature of the heat transfer fluid inside channel 309. In doing so, the heat transfer fluid cools down channel 309 and, through the plurality of Peltier modules, cools down the upper body of substrate table 301 and thermal surface 304.

In this embodiment, a DC voltage may still be desirable to enhance the cooling process. It should be noted, indeed, that if no DC voltage is applied to the plurality of Peltier modules, the cooling process may be slow due to the thermal barrier created by first thermal assembly 305. It follows that application of a relatively small DC voltage of negative polarity, or Cooling Voltage Vc, may be desirable to remove this thermal barrier in order to provide some additional cooling to the upper body of substrate table 301. For a given first thermal assembly, the value of Vc will depend on the heat transfer parameters of channel 309 and chiller 310. The result of this strategy is depicted in FIG. 5b (See curve 3). In this figure, the combined action of fast-response chiller 310 and the plurality of Peltier modules, supplied with the Vc voltage, accelerates the cooling phase. It should be kept in mind that application for a short period of time of a full DC voltage of negative polarity at the beginning of the cooling phase may still be beneficial to this cooling strategy. As can be seen in FIG. 5b, this may help in making a steeper front for the temperature change curve (See curve 4). This full DC voltage of negative polarity is then adjusted to the Vc voltage.

Finally, the temperature-hold phase may be controlled by the plurality of Peltier modules alone. In this situation, the heat-transfer fluid temperature may be kept at the same temperature.

Figure 6:
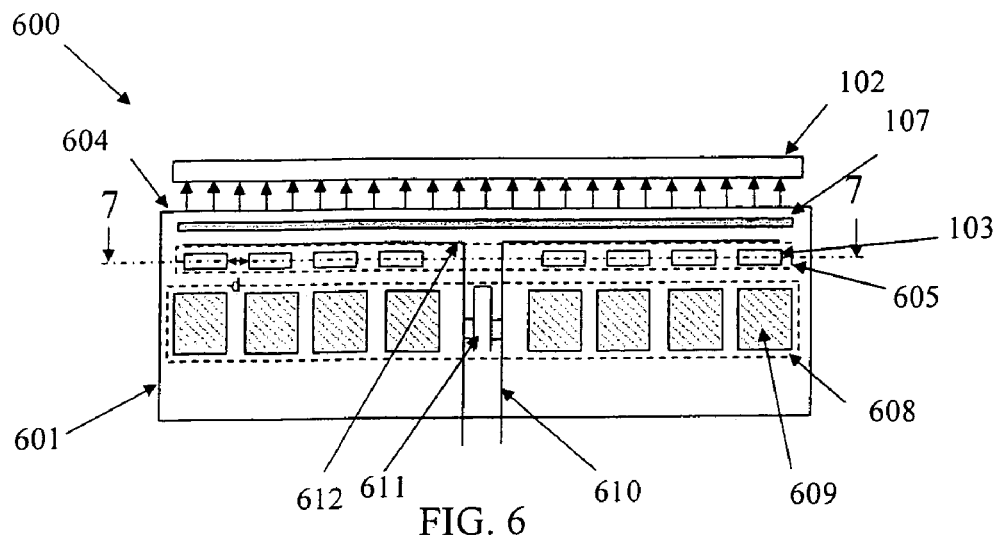
FIG. 6 is a cross sectional representation of a substrate holder, including an RF power source, according to an embodiment of the invention.

Referring now to FIG. 6, an embodiment of an apparatus for controlling the temperature of a substrate during substrate processing will be explained.

In this embodiment, an RF power is applied directly to the narrow upper body of substrate table 601. As can be seen in FIG. 6, apparatus 600 comprises substrate table 601 in which first thermal assembly 605, comprising a plurality of thermoelectric modules 103, and second thermal assembly 608 are arranged. Similarly to the embodiment represented in FIG. 1, second thermal assembly 608 includes channel 609 that carries a heat-transfer fluid. Apparatus 600 further comprises electrode 107 configured to electrostatically clamp substrate 102 during substrate processing. A flow of gas is likewise provided to enhance the thermal conductivity between substrate table 601 and substrate 102.

In the embodiment illustrated in FIG. 6, the RF power is directly supplied to the upper body of substrate table 601 via an RF assembly comprising RF cable 610, RF feeder 611 and RF connector 612. Although not shown in FIG. 6, RF cable 610 may be connected to an RF power generator and an RF impedance match network. In FIG. 6, the RF assembly extends through first and second assemblies, 605 and 608, in order to deliver the RF power close to thermal surface 604 where substrate 102 is disposed.

Figure 7:
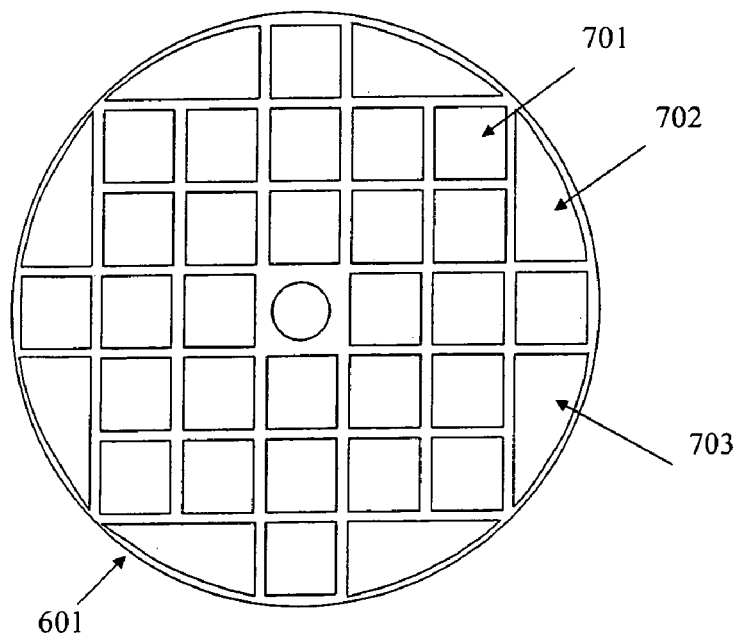
FIG. 7 is a cross-sectional view of the first thermal assembly taken along the 7-7 line in FIG. 6. This top view shows an arrangement of the plurality of thermoelectric modules according to an embodiment of the invention.

A schematic top view of the arrangement illustrated in FIG. 6 is shown in FIG. 7. This top view corresponds to a cross-section of substrate table 601 taken along the 7—7 line in FIG. 6.

As can be seen in FIG. 7, the plurality of thermoelectric modules 103 defines a plurality of thermoelectric surfaces that substantially completely underlie the thermal surface 604 of substrate table 601. Full thermal coverage of the thermal surface is achieved, in this embodiment of the invention, by paving first thermal assembly 605 with a combination of standard square shape modules 701 and custom made modules 702 and 703. The custom made square modules 702 and 703 may possess the same similar physical characteristics as the square shape modules 701. Their shape is designed to underlie the areas of thermal surface 604 that cannot be thermally covered with the standard square shape modules. In that way, a better thermal control of thermal surface 604 of substrate table 601 may be achieved. In this embodiment, each module may be independently controlled by a power source such that the temperature on the upper surface of each module may be separately adjusted. In another embodiment of the invention, the plurality of thermoelectric modules may be coupled to the same power source. In this latter configuration, the temperature of the modules changes uniformly as the voltage or the current supplied to these modules is modified. In the present invention, the thermal coverage of each module is dictated by its thermal surface. In FIG. 7, the size of the square shape module is set, for example to about 4 by about 4 by about 0.4 cm.

In the embodiment shown in FIG. 7, the central portion of the first thermal assembly has been left uncovered such that the RF power can be supplied to the narrow upper body of substrate table 601. In another embodiment of the invention, this empty space, which may be arranged in another part of the first thermal assembly (peripheral portion, for example), may accommodate a He supply and the corresponding lines for creating backside pressure, a connector temperature sensor, the connectors for applying DC voltage to clamping electrode 107 or possibly the pins for placing and removing substrate 102.

In order to maximize the thermal coverage, it may be desirable that the thermoelectric modules substantially completely underlie thermal surface 604. Correspondingly, the thermoelectric modules are put close to each other in an embodiment of the invention. In this embodiment, the distance between adjacent modules is less than a few millimeters, for example less than about 10 mm (or no more than 10 mm). For that arrangement, the contacts on the thermoelectric modules may be specially arranged. In an embodiment of the invention, these contacts may go directly from one module to another or may follow other arrangements in order to allow for a tight configuration. In yet another embodiment of the invention, no empty space is created within the first assembly and the plurality of thermoelectric modules substantially paves the entire area defined by upper surface 604. An example of such an embodiment is represented in FIGS. 8 and 9.

Figure 8:
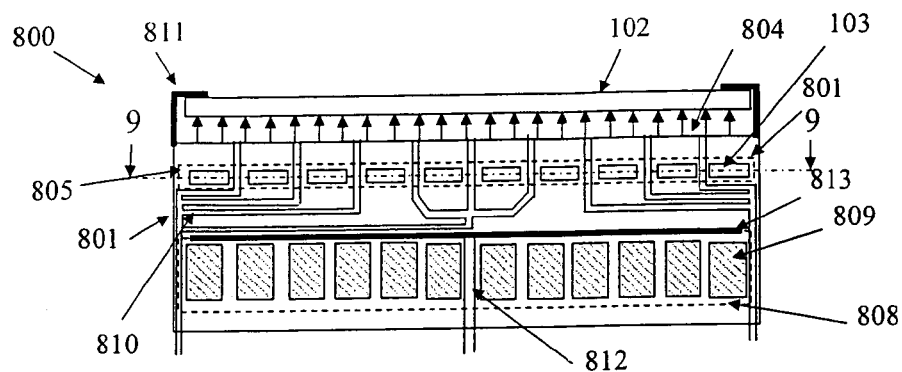
FIG. 8 is a cross sectional representation of a substrate holder, including a gas assembly, according to an embodiment of the invention.

In FIG. 8, apparatus 800 comprises substrate table 801 in which first thermal assembly 805 and second thermal assembly 808 are arranged. Apparatus 800 also comprises thermal surface 804, which supports substrate 102, and gas line assembly 810 that provides backside pressure to substrate 102. In this embodiment, substrate 102 is mechanically clamped to the thermal surface with clamping assembly 811. Apparatus 800 further includes an RF power assembly comprising RF connector 812 coupled to RF power plate 813. In the embodiment shown in FIG. 8, the RF plate is arranged between first and second thermal assemblies, 805 and 808. In this configuration, the material constituting RF power plate 813 is selected so as not to form a thermal barrier to second thermal assembly 808. In an alternative embodiment, power plate 813 may be disposed underneath second thermal assembly 808. As can be seen in FIG. 8, the gas lines of the power assembly are disposed between the plurality of thermoelectric modules 103 and channels 809.

Figure 9:
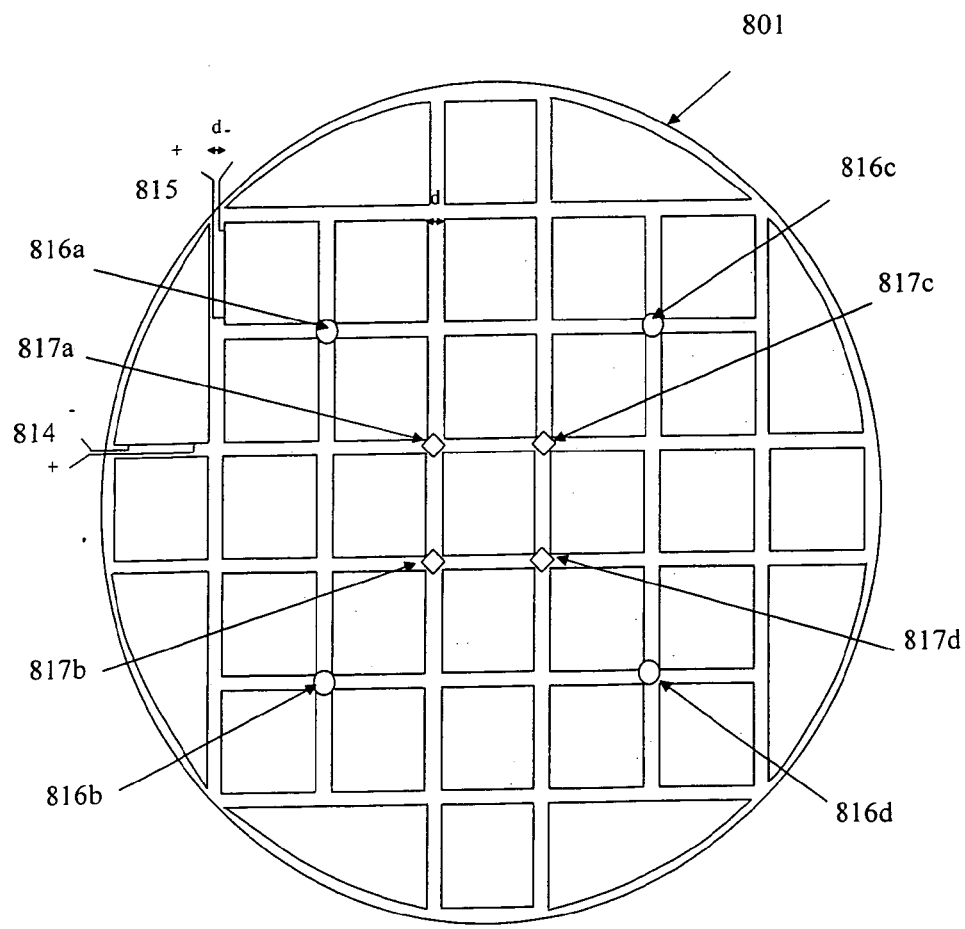
FIG. 9 is a cross-sectional view of the first thermal assembly taken along the 9-9 line in FIG. 8. This top view shows an arrangement of the plurality of thermoelectric modules according to an embodiment of the invention.

FIG. 9 represents a schematic cross section of substrate table 801 taken along the 9—9 line in FIG. 8. This cross section illustrates how the plurality of thermoelectric modules is arranged within first thermal assembly 805.

As shown in FIG. 9, the plurality of modules 103 defines a plurality of thermoelectric surfaces that substantially completely underlie thermal surface 804. In this embodiment, the modules are spaced apart at a distance d, which is determined to allow passage of electrical connections 814 and 815 to modules 103 and gas lines 816$a$–$d$ of gas assembly 810. In an embodiment of the invention, the distance d has a value of about 10 mm. The distance d between the modules may also allow passage of pins 817$a$–$d$ that are configured to place and remove substrate 102. Although it may be desirable to better control thermal surface 804, it should be understood that the distance d separating two adjacent modules may not be the same everywhere. Thus, this distance may have different values within the first thermal assembly 805 and will depend primarily on the wiring arrangement. Furthermore, it should be understood that it may be appropriate to change the shapes of modules 803 near the location of the above mentioned elements (gas lines, pins, wires) in order to accommodate them.

Figure 10A:
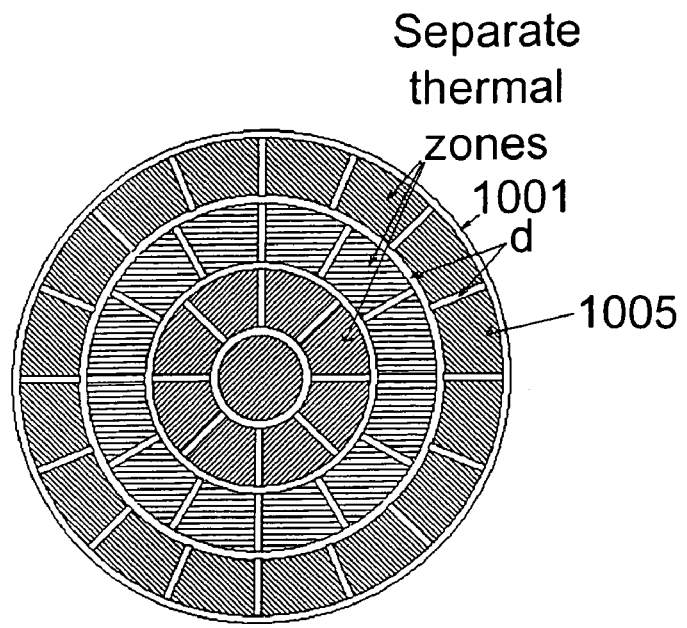
FIG. 10a is a top view of a thermal assembly comprising a plurality of thermoelectric modules according to an embodiment of the invention.
Figure 10B:
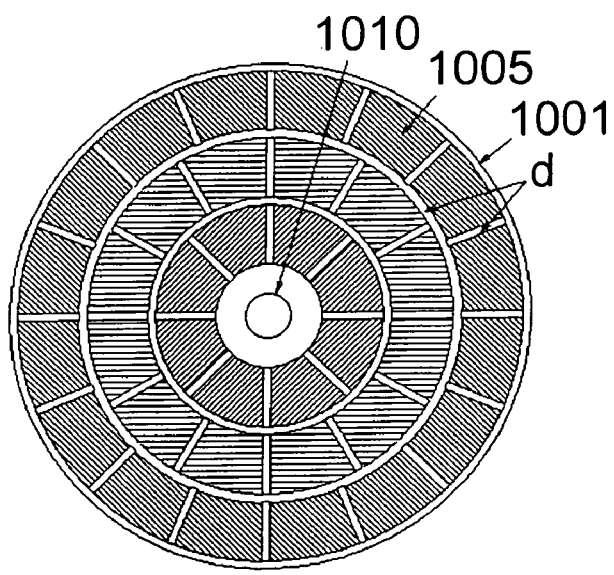
FIG. 10b is a top view of a thermal assembly comprising a plurality of thermoelectric modules according to an embodiment of the invention. In this embodiment, an RF power source is included in the substrate holder.

As mentioned previously, the techniques used to manufacture thermoelectric modules and Peltier elements, in particular, are well developed. It follows that the size and the characteristics of these modules may easily be adjusted. An example of module arrangement combining different shapes is illustrated in FIG. 10*a*. This figure represents a top view of first thermal assembly 1005, which is arranged in substrate table 1001. In this embodiment, the thermoelectric modules are wired in groups such that several thermal zones (a central, an intermediate and a peripheral zone) are created within first thermal assembly 1005. These thermal zones, which are depicted with different hashings in FIG. 10*a*, extend radially relative to the center of substrate table 1001. In this configuration, each zone has a separate wiring and is controlled by a separate voltage or current. An example of another module arrangement is given in FIG. 10*b*. In this figure, the thermoelectric modules are identical to those depicted in FIG. 10*a*. In this arrangement, however, an empty space has been created in central portion 1010 of first assembly 1005 in order to allow passage of the RF power to the narrow upper body of substrate table 1001, or possible pins or temperature sensors.

Figure 11:
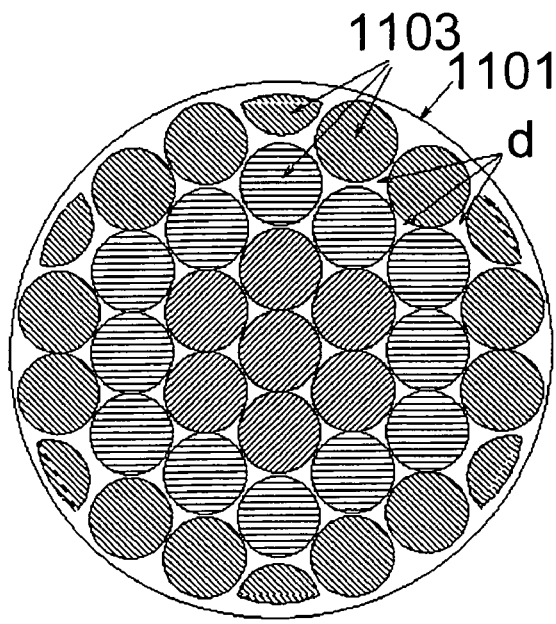
FIG. 11 is a top view of a thermal assembly comprising a plurality of thermoelectric modules according to an embodiment of the invention.
Figure 12:
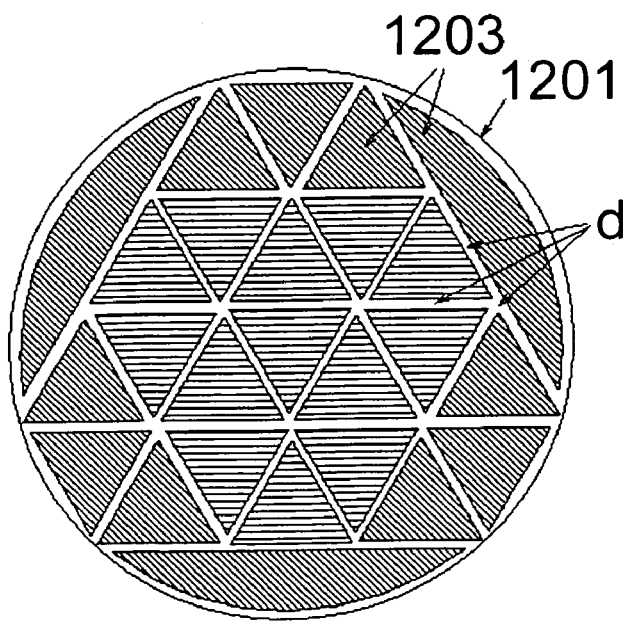
FIG. 12 is a top view of a thermal assembly comprising a plurality of thermoelectric modules according to an embodiment of the invention.
Figure 13:
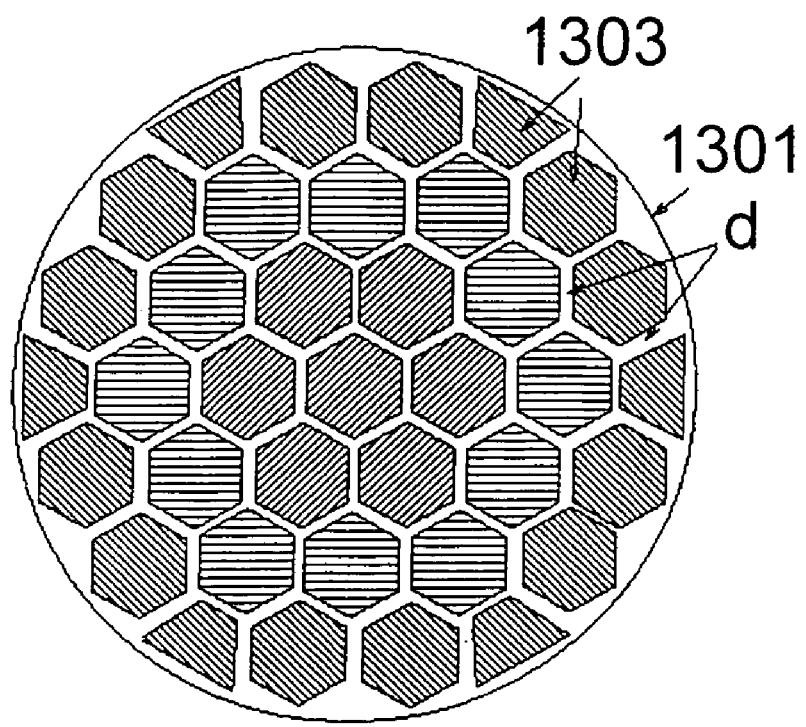
FIG. 13 is a top view of a thermal assembly comprising a plurality of thermoelectric modules according to an embodiment of the invention.

Alternative embodiments of module arrangements combining different shapes of modules (1103, 1203, and 1303) are illustrated in FIGS. 11, 12 and 13. In these embodiments, the shapes of the modules are selected to maximize the thermal coverage of the thermal surface. Several thermal zones have also been represented in these embodiments. It should be kept in mind that alternative shapes and additional thermal zones may also be used in other embodiments of the invention. These shapes should primarily be selected in accordance with the geometry of the thermal surface.

While a detailed description of presently preferred embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. An apparatus for controlling a temperature of a substrate, the substrate having a lower surface and an upper surface on which a substrate processing is performed, the apparatus comprising:
   a substrate table having a thermal surface supporting the substrate lower surface;
   a first thermal assembly arranged in the substrate table and comprising a plurality of thermoelectric modules, each of the plurality of thermoelectric modules having a thermoelectric surface such that the plurality of thermoelectric modules defines a plurality of thermoelectric surfaces,
   wherein:
   the plurality of thermoelectric surfaces is in thermal communication with the thermal surface and includes various shapes of thermoelectric surfaces,
   the plurality of thermoelectric surfaces is configured to substantially completely underlie the thermal surfaces,
   at least two thermoelectric modules of the plurality of thermoelectric modules are arranged such that a space is defined between them,
   one or more elements selected from a group consisting of wires for the thermoelectric modules, gas lines, and pins configured to place and remove the substrate is placed in the space between the thermoelectric modules;
   a second thermal assembly in thermal communication with the thermal surface, wherein the second thermal assembly comprises a channel that carries a heat-transfer fluid;
   a temperature sensor constructed and arranged to detect a temperature on the thermal surface; and
   a control unit that adjusts a power supplied to at least one of the plurality of thermoelectric modules on the basis of the temperature detected on the thermal surface.

2. An apparatus as recited in claim 1, wherein at least one of the plurality of thermoelectric modules is a Peltier module.

3. An apparatus as recited in claim 2, wherein the Peltier module is a multi-stage Peltier module.

4. An apparatus as recited in claim 1, wherein a dimension of the space is no more than about 10 mm.

5. An apparatus as recited in claim 1, further comprising a power supply providing required voltage and current to the plurality of thermoelectric modules.

6. An apparatus as recited in claim 1, wherein the plurality of thermoelectric modules forms a thermoelectric control layer, the thermoelectric control layer having a thickness within a range of a few millimeters.

7. An apparatus as recited in claim 6, wherein the thickness of the thermoelectric control layer is within a range from about 2 to about 9 mm.

8. An apparatus as recited in claim 1, wherein the thermal surface is located within a vacuum process chamber.

9. An apparatus as recited in claim 8, wherein the vacuum process chamber is a plasma process chamber.

10. An apparatus as recited in claim 1, further comprising an electrode arranged in the substrate table and configured to electro-statically clamp the substrate to the thermal surface of the substrate table.

11. An apparatus as recited in claim 1, wherein the first thermal assembly has a faster thermal response than the second thermal assembly.

12. An apparatus as recited in claim 1, wherein the second thermal assembly comprises a chiller constructed and arranged to control a flow rate and a temperature of the heat-transfer fluid.

13. An apparatus as recited in claim 1, further comprising a gas conduit passing through the substrate table and having a first end open to the thermal surface and a second end opposite the first end such that a gas can flow through said conduit and provide backside pressure to the substrate.

14. An apparatus as recited in claim 1, further comprising an RF power plate arranged in the substrate table and an RF power connector that connects the RF power plate to an RF power supply.

15. An apparatus as recited in claim 1, further comprising a pin constructed and arranged to place and remove the substrate on the thermal surface wherein the pin passes through the first thermal assembly.

16. An apparatus as recited in claim 1, wherein each of the plurality of thermoelectric modules is supplied with separate power.

17. An apparatus as recited in claim 1, wherein groups of the thermoelectric modules are wired together such that separate thermal zones are created within the thermal surface.

18. An apparatus as recited in claim 17, wherein the thermal surface comprises a central, an intermediate and a peripheral zone.

19. An apparatus as recited in claim 1, further comprising at least a heat sink or a heat source in thermal communication with the substrate table.

20. An apparatus as recited in claim 1, wherein the second thermal assembly acts as a heat sink for the first thermal assembly.

21. An apparatus as recited in claim 1, wherein the second thermal assembly is controlled by a fast temperature response apparatus.

22. An apparatus as recited in claim 1, wherein the various shapes of the thermoelectric surfaces include a rectangular shape, a square shape, a polygonal shape, an oval shape, a circular shape, a ring shape or a combination of two or more thereof.

23. An apparatus as recited in claim 1, wherein a distance separating the thermal surface from the plurality of thermoelectric modules is within a range of 1 to 10 mm.

24. An apparatus as recited in claim 1, further comprising mechanical or suction clamps to clamp the substrate.

25. An apparatus as recited in claim 1, wherein the control unit is configured to prevent temperature overshooting during fast heating or fast cooling of the thermal surface.

26. An apparatus as recited in claim 25, wherein during fast heating the temperature of the thermal surface increases quickly and then slowly when the temperature of the thermal surface is substantially close to a desired temperature.

27. An apparatus as recited in claim 26, wherein during fast cooling the temperature of the thermal surface decreases quickly and then slowly when the temperature of the thermal surface is substantially close to a desired temperature.

28. A method of making a substrate table capable of controlling a temperature of a substrate, the substrate having an upper surface and a lower surface supported by a thermal surface of the substrate table on processing of the substrate is performed, the method comprising:

arranging a plurality of thermoelectric modules in the substrate table, the plurality of thermoelectric modules defining a plurality of thermoelectric surfaces, the plurality of thermoelectric surfaces including various shapes the plurality of thermoelectric modules defining a first thermal assembly, wherein:

the plurality of thermoelectric surfaces is in thermal communication with and completely underlies the thermal surface, at least two thermoelectric modules of the plurality of thermoelectric modules are arranged such that a space is defined between them, one or more elements selected from a group consisting of wires for the thermoelectric modules, gas lines, and pins configured to place and remove the substrate is placed in the space between the thermoelectric modules;

arranging a second thermal assembly in thermal communication with the thermal surface wherein the second thermal assembly comprises a channel that carries a heat-transfer fluid;

positioning a temperature sensor to detect a temperature on the thermal surface; and adjusting, via a control unit, a power supplied to at least one of the plurality of thermoelectric modules on the basis of the temperature detected on the thermal surface.

29. A method as recited in claim 28, wherein the arranging comprises optimizing an arrangement of the plurality of the thermoelectric surfaces such that the plurality of thermal surfaces substantially completely underlies the thermal surface.

30. A method as recited in claim 29, wherein the optimizing comprises selecting the various shapes of thermoelectric surfaces such that the plurality of thermal surfaces substantially completely underlies the thermal surface.

31. A method as recited in claim 28, wherein at least one of the plurality of thermoelectric modules is a Peltier module.

32. A method as recited in claim 31, wherein the Peltier module is a multi-stage Peltier Module.

33. A method of controlling a temperature of a substrate, the substrate having an upper surface and a lower surface supported by a thermal surface of a substrate table on which processing of the substrate is performed, the method comprising:

arranging a plurality of thermoelectric modules in the substrate table, the plurality of thermoelectric modules defining a plurality of thermoelectric surfaces, the plurality of thermoelectric surfaces including various shapes, the plurality of thermoelectric modules defining a first thermal assembly, wherein:

the plurality of thermoelectric surfaces is in thermal communication with and completely underlies the thermal surface, at least two thermoelectric modules of the plurality of thermoelectric modules are arranged such that a space is defined between them, one or more elements selected from a group consisting of wires for the thermoelectric modules, gas lines, and pins configured to place and remove the substrate is placed in the space between the thermoelectric modules;

arranging a second thermal assembly in thermal communication with the thermal surface, wherein the second thermal assembly comprises a channel that carries a heat-transfer fluid;

positioning a temperature sensor to detect a temperature on the thermal surface; and controlling a temperature of the thermal surface with the plurality of thermoelectric modules.

34. A method as recited in claim 33, further comprising detecting a temperature of at least a portion of the thermal surface with the temperature sensor.

35. A method as recited in claim 33, further comprising controlling the temperature of the thermal surface with the second thermal assembly arranged in the substrate table, the second thermal assembly including a channel that carries a heat-transfer fluid.

36. A method as recited in claim 35, wherein during a heating phase controlling the temperature of the thermal surface with the plurality of thermoelectric modules comprises supplying the plurality of thermoelectric modules with a high positive voltage and controlling the temperature of the thermal surface with the second thermal assembly comprises supplying the channel with a high temperature heat-transfer fluid.

37. A method as recited in claim 35, wherein during a small temperature change in a cooling phase controlling the temperature of the thermal surface with the plurality of thermoelectric modules comprises supplying the plurality of thermoelectric modules with a high negative voltage and controlling the temperature of the thermal surface with the second thermal assembly comprises supplying the channel with a low temperature heat-transfer fluid.

38. A method as recited in claim 35, wherein during a large temperature change in a cooling phase controlling the temperature of the thermal surface with the plurality of thermoelectric modules comprises supplying the plurality of thermoelectric modules with a high negative voltage and controlling the temperature of the thermal surface with the second thermal assembly comprises supplying the channel with a low temperature heat-transfer fluid.

39. A method as recited in claim 35, wherein during a large temperature change in a cooling phase controlling the temperature of the thermal surface with the plurality of thermoelectric modules comprises supplying the plurality of thermoelectric modifies with a low negative voltage and controlling the temperature of the thermal surface with the second thermal assembly comprises supplying the channel with a low temperature heat-transfer fluid.

40. A method as recited in claim 33 further comprising providing a gas flow between the thermal surface and the lower surface of the substrate to enhance the control of the temperature of the substrate.

41. A method as recited in claim 33, wherein controlling the temperature of the thermal surface comprises wiring the plurality of thermoelectric modules in separate groups such that separate thermal zones are created within the thermal surface.

42. A method as recited in claim 33, wherein during fast heating or fast cooling of the thermal surface, a power supplied to the plurality of thermoelectric modules is adjusted in order to prevent temperature overshooting.

* * * * *